United States Patent [19]

Ishikawa et al.

[11] Patent Number: 5,079,525
[45] Date of Patent: Jan. 7, 1992

[54] AUDIO-VIDEO MODULATOR SYSTEM ON IC CHIP

[75] Inventors: Nobuyuki Ishikawa; Hiroshi Higuchi; Hisaaki Narahara; Shinichi Tanabe; Fumio Ishikawa, all of Kanagawa, Japan

[73] Assignee: Sony Corporation, Tokyo, Japan

[21] Appl. No.: 622,954

[22] Filed: Dec. 6, 1990

[30] Foreign Application Priority Data

Dec. 8, 1989 [JP] Japan ................................ 1-317590
Dec. 8, 1989 [JP] Japan ................................ 1-317591
Dec. 29, 1989 [JP] Japan ................................ 1-343890

[51] Int. Cl.$^5$ ............................................. H04N 5/40
[52] U.S. Cl. .................................... 332/120; 332/127; 455/102; 455/119; 358/23; 358/330; 360/29; 370/11; 370/121
[58] Field of Search ............... 332/120, 127, 149, 151, 332/152; 358/330, 23, 24, 25; 455/102, 108, 119; 360/29, 30; 370/11, 69.1, 121, 122

[56] References Cited

U.S. PATENT DOCUMENTS 3,775,554 11/1973 Hjortzberg ................ 358/330 X
4,654,607 3/1987 Ishikawa ................ 332/155

Primary Examiner—Siegfried H. Grimm
Attorney, Agent, or Firm—Hill, Van Santen, Steadman & Simpson

[57] ABSTRACT

An RF modulator comprising an FM modulator supplied with an audio signal, and AM modulator supplied with the FM modulator output and a video signal, an oscillator for generating a sound subcarrier signal, and an oscillator for generating a main carrier signal. Each of the oscillators consists of a VCO with a PLL circuit, and the entire components are composed of a single IC chip so as to be formed into a compact miniature structure. A modified RF modulator includes a PLL circuit for varying the oscillation frequency of a VCO by a variable frequency divider, and a modulation circuit supplied with a modulating signal and the oscillation output of the VCO. The division ratio (integer) of the variable frequency divider is continuously varied, and the reference frequency of a reference oscillator is set to be less than a predetermined channel interval frequency, thereby reducing the frequency error in the modulated signal output.

5 Claims, 7 Drawing Sheets

AUDIO-VIDEO MODULATOR SYSTEM ON IC CHIP

BACKGROUND OF THE INVENTION

1. Field of the Invention

The present invention relates to an RF (radio frequency) modulator for transmission of an audio signal and a video signal through frequency-division multiplexing, and more particularly to a modulation circuit and a PLL (phase-locked loop) circuit relative thereto in a compact miniature RF modulator adapted for use in VHF-UHF television.

2. Description of the Prior Art

There is known a conventional example of an RF converter as disclosed in U.S. Pat. No. 4,654,607. First the operation of such exemplary converter will be described below with reference to FIG. 1 which shows the circuit configuration thereof.

The above modulator comprises bipolar transistors. A video signal $e_V'$ is supplied to both bases of transistors Q5 and Q6 of a differential amplifier 6, and the output thereof is supplied as a signal current to a common emitter junction of paired differential transistors Q1 and Q2 which constitute a double balanced modulator.

Meanwhile a frequency-modulated (FM) audio signal $e_A$ is supplied to both bases of transistors Q7 and Q8 constituting a differential amplifier 7, and the output thereof is supplied as a signal current from a collector of the transistor Q7 to a common emitter junction of paired differential transistors Q4 and Q5 constituting a double balanced modulator.

Signals of modulation frequencies fc, $\overline{fc}$ are supplied respectively to the bases of paired differential amplifier transistors 4, 5 of such double balanced modulator and are amplitude-modulated by the video signal $e_V'$ and the FM audio signal.

The outputs of the paired differential transistors 4 and 5 are combined with each other and, after being amplified by a buffer amplifier 3, the combined output is taken out as an AM carrier signal from an output terminal 2.

For frequency modulation of an audio signal, it is generally customary to employ a voltage controlled oscillator (VCO).

In the VHF band, an oscillator with an SAW resonator is used for generating the carrier signals fc, $\overline{fc}$ which are to be modulated by the video signal $e_V'$ and the FM audio signal $e_A$. Meanwhile in the UHF band, it is usual to use an LC oscillator with a coaxial resonant circuit consisting of a variable capacitor.

The modulator for use in a VHF video tape recorder (VTR) is so designed as to be switchable merely to two channels due to employment of an SAW resonator. Meanwhile the UHF RF modulator is designed to be adjustable to a selected channel with control of a variable capacitor due to employment of a coaxial resonant circuit. Each of such two types is operated manually.

Although the RF converter mentioned above is adoptable for transmission of an audio signal and a video signal through frequency-division multiplexing, no contrivance is proposed with regard to realization of an IC (integrated circuit) configuration.

OBJECTS AND SUMMARY OF THE INVENTION

In an attempt to eliminate the drawbacks mentioned, the present invention has been accomplished to provide an improved RF modulator free from the above disadvantages as well as to provide a novel PLL (phase-locked loop) circuit capable of minimizing the frequency error in the modulated signal output of the modulator.

A first object of the present invention is to generate a high frequency carrier, which is to be modulated by an audio signal and a video signal, from an oscillator with a PLL circuit in an RF modulator.

A second object of the present invention is to generate a carrier to be modulated by an audio signal from an oscillator with a PLL circuit, and also to generate a carrier to be modulated by a video signal and a frequency-modulated signal from an oscillator with a PLL circuit.

And a third object of the present invention is to provide a PLL circuit employed for an oscillator which generates a carrier to be modulated by an audio signal and a video signal.

According to one aspect of the present invention, there is provided an RF modulator comprising an FM modulator supplied with an audio signal, an AM modulator supplied with the FM output and a video signal, an oscillator for generating a sound subcarrier signal, and an oscillator for generating a main carrier signal. The latter oscillator consists of a VCO (voltage-controlled oscillator) with a PLL circuit, and the entirety of the above components are composed of a single IC chip so as to be formed into a miniature structure.

According to another aspect of the invention, there is provided an RF modulator comprising an FM modulator supplied with an audio signal, an AM modulator supplied with the FM output and a video signal, an oscillator for generating a sound subcarrier signal, and an oscillator for generating a main carrier signal. Each of the two oscillators consists of a VCO with a PLL circuit, and the entire components are composed of a single IC chip so as to be structurally miniaturized.

According to a further aspect of the invention, there is provided an RF modulator comprising a PLL circuit for varying the oscillation frequency of a VCO by a variable frequency divider, and a modulation circuit supplied with a modulated signal and the output of the VCO. The division ratio (integer) of the variable frequency divider is continuously varied, and the reference frequency of a reference oscillator is set to be smaller than a predetermined channel interval frequency, thereby reducing the frequency error in the modulated signal output.

The above and other features of the present invention will become apparent from the following description which will be given with reference to the illustrative accompanying drawings.

DESCRIPTION OF THE PREFERRED EMBODIMENTS

Hereinafter a first embodiment of the present invention will be described with reference to the accompanying drawings.

Figure 2:
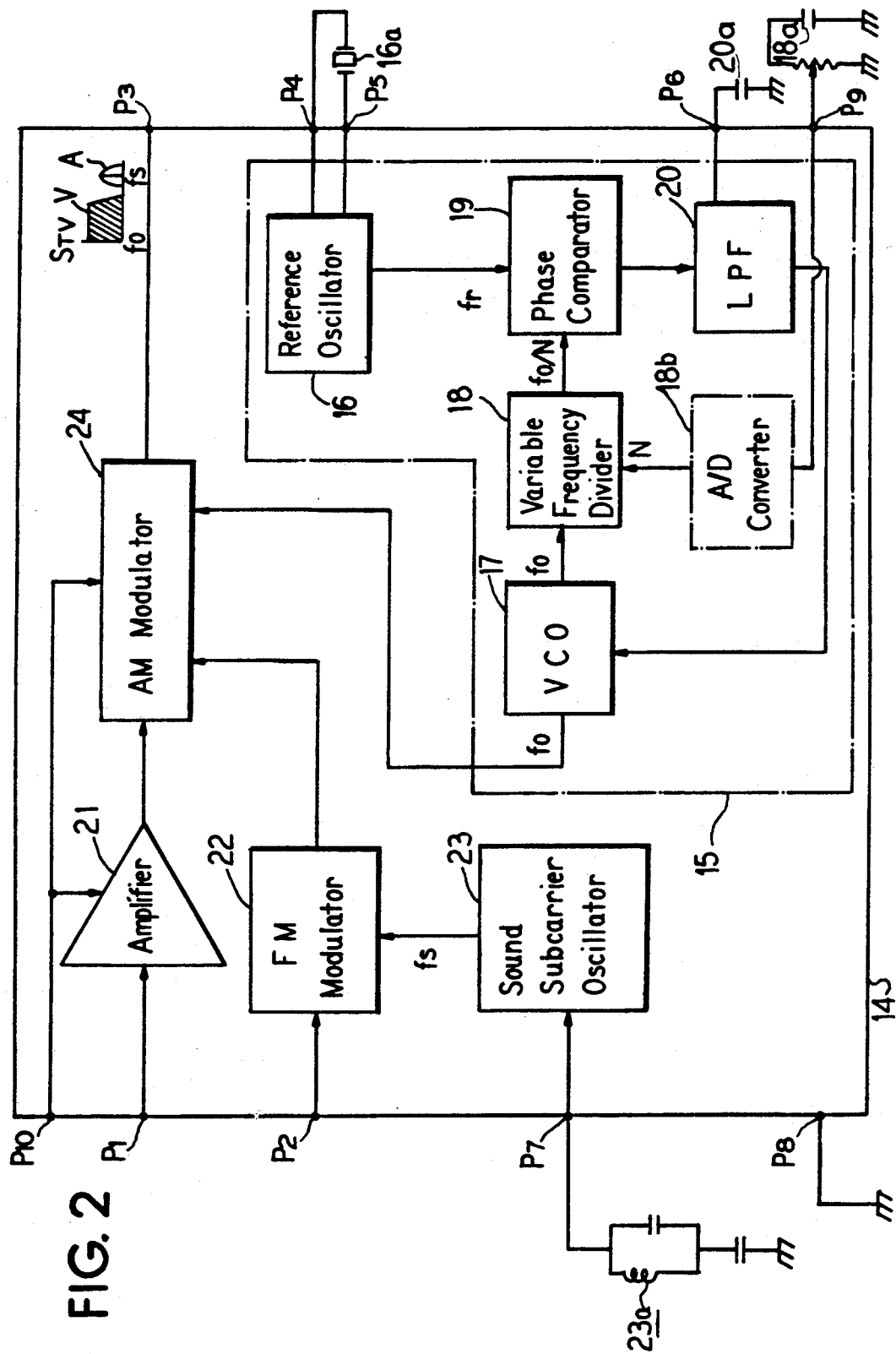
FIG. 2 shows an RF modulator of the present invention for amplitude-modulating, by a video signal and an FM audio signal, a carrier outputted from an oscillator with a PLL circuit.

FIG. 2 is a block diagram showing a fundamental constitution of an RF modulator according to the present invention, in which reference numeral 14 denotes a chip of integrated circuit (IC) as a whole.

This diagram represents an example where an oscillator with a PLL circuit is employed for generating a carrier which is to be amplitude-modulated by a video signal and a frequency-modulated audio signal. Denoted by 15 is a PLL circuit which comprises a reference oscillator 16 for generating a reference frequency signal of a reference frequency $f_r$, a VCO (voltage-controlled oscillator) 17, a variable frequency divider 18 of a division ratio N, and a phase comparator 19. The oscillation output of the VCO 17 is divided by the variable frequency divider 18 and then is compared with the reference frequency $f_r$ of the reference oscillator 16 by the phase comparator 19. The comparison output obtained therefrom is supplied to the VCO 17 via an LPF (low pass filter) 20, thereby controlling the frequency and the phase of the VCO 17. There are also shown an input terminal P1 supplied with a video signal (V); an input terminal P2 supplied with an audio signal (A); an amplifier 21 connected to the input terminal P1; an FM modulator 22 which receives the audio signal (A) from the input terminal P2 and also a sound subcarrier signal of a frequency $f_s$ from a sound subcarrier signal oscillator 23; and an AM modulator 24 for amplitude-modulating the video signal (V) amplified by the amplifier 21 and the frequency-modulated output of the FM modulator 22. A main carrier signal of a frequency $f_0$ is supplied from the VCO 17 of the PLL circuit 15 to the other input terminal of the AM modulator 24, and the amplitude-modulated output (television signal) $S_{TV}$ is supplied to an output terminal P3. Also shown are an external crystal 16a connected between terminals P4 and P5 for the reference oscillator 16; an external capacitor 20a connected to a terminal P6 for the LPF 20; and an external parallel resonant circuit 23a connected to a terminal P7 for the sound subcarrier signal oscillator 23. The resonance frequency of the circuit 23a is selectively set to, e.g., 4.5 MHz. There are further shown a ground terminal P8 of the IC chip 14, a terminal P9 through which a control voltage of a potentiometer 18a is applied to an A-D (analog-to-digital) converter 18b when necessary to change the division ratio N of the variable frequency divider 18. Denoted by P10 is a power supply terminal.

In the above constitution, when the video signal (V) and the audio signal (A) are supplied to the input terminals P1 and P2 respectively, the video signal (V) is amplified by the amplifier 21 (with while clip when necessary) and then is supplied to the AM modulator 24.

Meanwhile the audio signal (A) is supplied to the FM modulator 22 where the sound subcarrier signal having a frequency $f_s$ of 4.5 MHz for example is thereby frequency-modulated, and then the modulated output is supplied to the AM modulator 24. The output of the AM modulator 24 is fed for amplitude-modulating the main carrier signal of a frequency $f_0$ supplied from the VCO 17 of the PLL circuit 15, and thus the amplitude-modulated signal is obtained from the output terminal P3. In this case, the division ratio N of the variable frequency divider 18 is varied for changing the frequency $f_0$ of the modulated output $S_{TV}$ in accordance with each channel frequency of, for example, channels 13 to 64 in the UHF on band (470–630 MHz). In an example where the reference frequency $f_r$ of the reference oscillator 16 is 1 MHz, the frequency division ratio N becomes $f_0/f_r$ when the PLL circuit 15 is locked, so that is the ratio N is changed between 470 and 630, it is possible to set the main carrier frequency $f_0$ to a desired channel frequency at a step of 1 MHz.

According to the present invention, all of the above-described FM modulator 22, sound subcarrier signal oscillator 23, AM modulator 24 and PLL circuit 15 are composed of a single IC chip 14 to be consequently formed into a miniature structure, and the frequency $f_0$ of the main carrier signal can be stabilized dispite occurrence of any temperature fluctuation.

Referring now to a block diagram of FIG. 3, a description will be given on a second embodiment where the present invention is applied to a VTR (video tape recorder).

Figure 1:
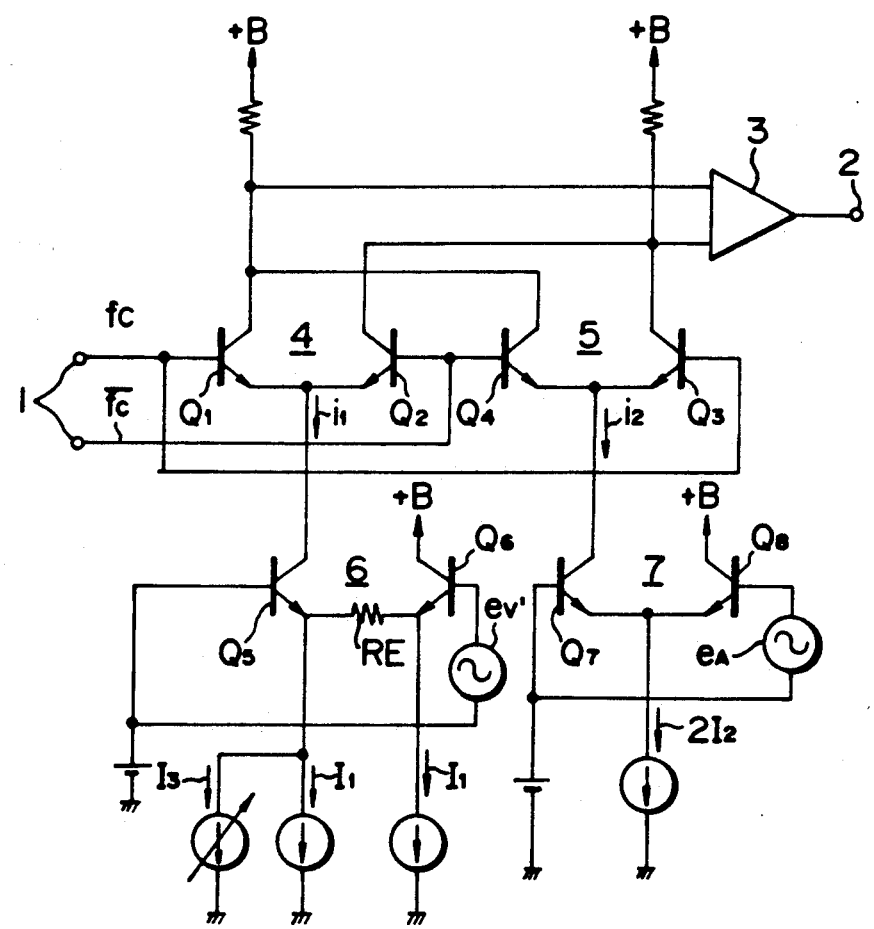
FIG. 1 shows a circuit configuration of a conventional AM modulator.
Figure 3:
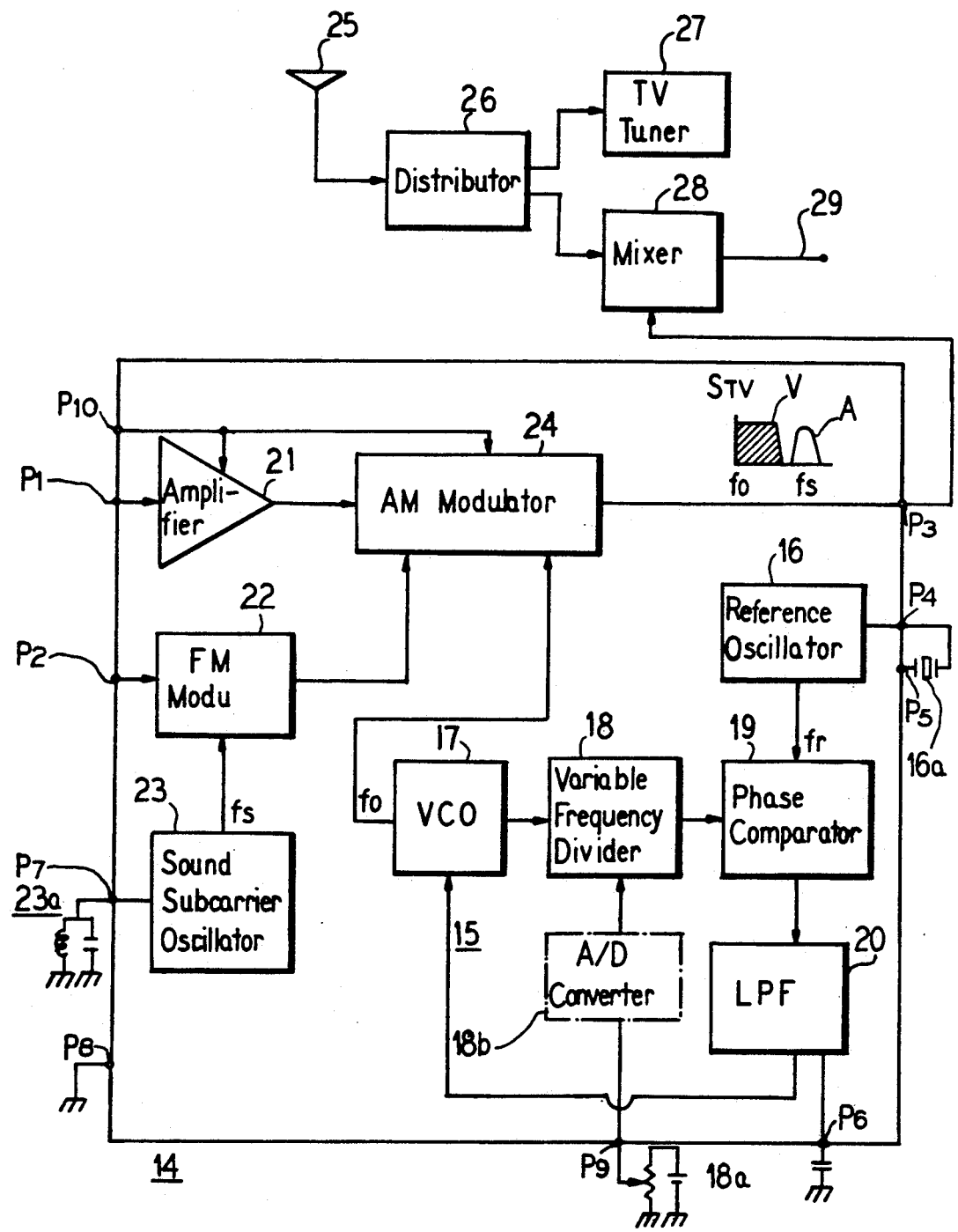
FIG. 3 shows an embodiment of the present invention where the RF modulator of FIG. 2 is employed in a video tape recorder.

In FIG. 3, there are included a television antenna 25 and a distributor 26. A television signal from the distributor 26 is supplied to a television tuner 27 and one input terminal of a mixer 28. The other input terminal of the mixer 28 is connected to an output terminal P3 of an IC chip 14 and is thereby supplied with an AM output $S_{TV}$ from an AM modulator 24. And the output of the mixer 28 is supplied to an RF output terminal 29. Since the other circuit configuration is the same as that shown in FIG. 1, a detailed description thereof is omitted here.

In the above constitution, a video signal (V) and an audio signal (A) are supplied respectively to the input terminals P1 and P2 of the single IC chip 14, and the division ratio N of a variable frequency divider 18 in the PLL circuit 15 is set to 630 for example. Then a modulated main carrier signal having a frequency $f_0$ of 630 MHz is obtained as an AM output $S_{TV}$ from an RF output terminal 29, so that a playback output of the VTR can be monitored by feeding such AM output $S_{TV}$ to an unshown television receiver. In this case also, satisfactory function and effect can be expected as in the aforementioned RF modulator of FIG. 2. The sound subcarrier signal oscillator 23 may be formed of another PLL circuit. In such a case, an external parallel resonant circuit 23a and a terminal P7 can be dispensed with.

As is obvious from the above description, according to the present invention where the main carrier signal is amplitude-modulated by the video signal and the FM output obtained through frequency modulation of the sound subcarrier signal by the audio signal, the AM output processed through frequency-division multiplexing can be obtained with facility as a signal of a desired channel frequency by varying the frequency division ratio of the PLL circuit.

Furthermore, there is attainable another advantage that, since all of the above-described FM modulator, sound subcarrier signal oscillator, AM modulator and PLL circuit are composed of a single IC chip, the structure can be miniaturized and the frequency of the main carrier signal can be stabilized despite occurrence of any temperature fluctuation.

Hereinafter a third embodiment of the present invention will be described with reference to FIG. 4. In this embodiment, a carrier to be frequency-modulated by an AM audio signal is generated from an oscillator with a PLL circuit.

And another carrier to be modulated by such FM audio signal and a video signal is generated from another oscillator with a PLL circuit.

Now a detailed description will be given below with regard to the third embodiment.

Figure 4:
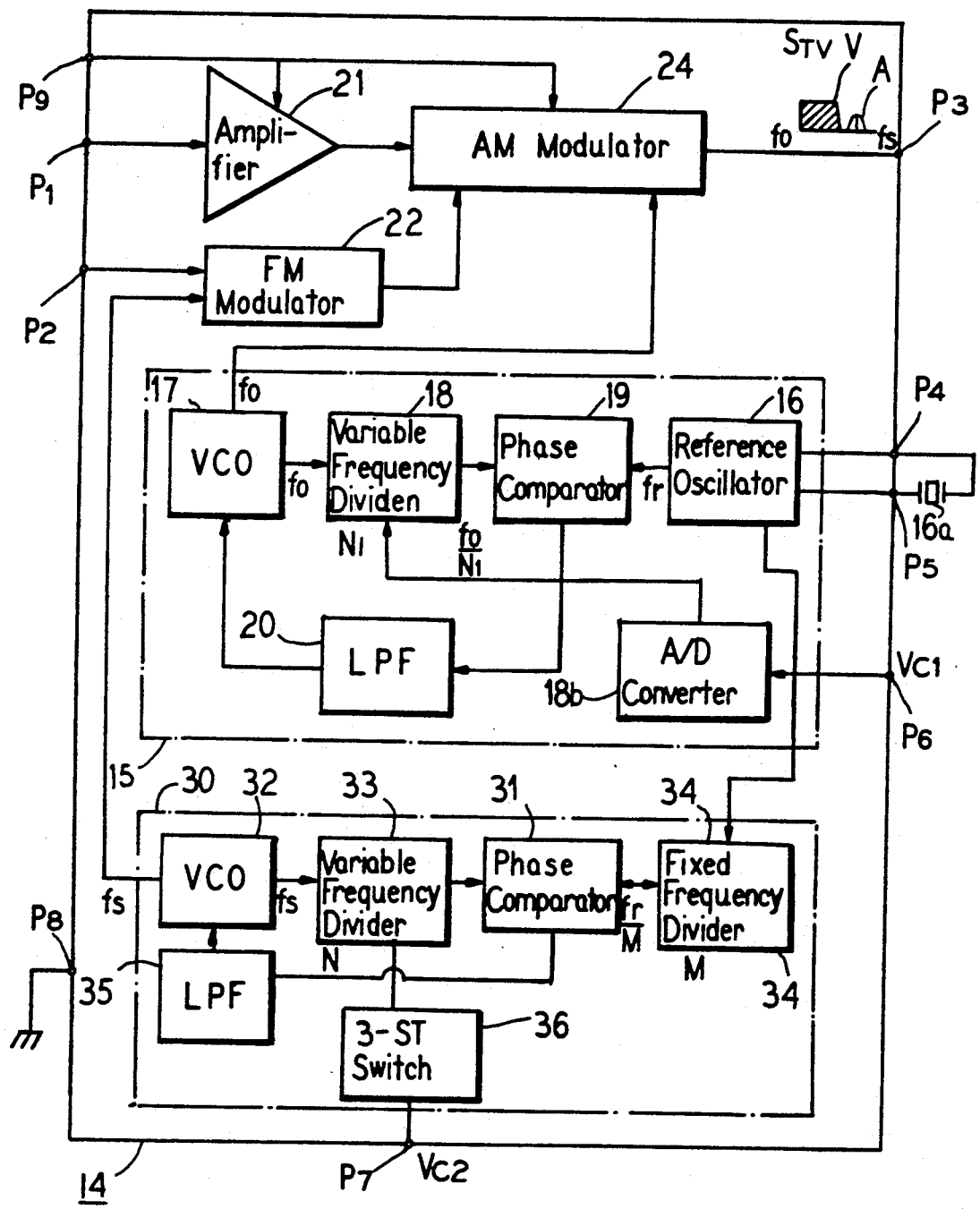
FIG. 4 shows an embodiment of the invention for generating, from an oscillator with a PLL circuit, a carrier to be frequency-modulated by an audio signal.

FIG. 4 is a block diagram showing a fundamental constitution of an RF modulator according to the present invention, in which reference numeral 14 denotes a chip of integrated circuit as a whole. Denoted by 15 is a first PLL circuit which comprises a reference oscillator 16 for generating a reference frequency signal of a reference frequency $f_r$, a VCO (voltage-controlled oscillator)17, a variable frequency divider 18 of a division ratio N1, and a phase comparator 19. The oscillation output of the VCO 17 is divided by the variable frequency divider 18 and then is compared with the reference frequency $f_r$ of the reference oscillator 16 by the phase comparator 19. The comparison output obtained therefrom is supplied to the VCO 17 via an LPF (low pass filter) 20, thereby controlling the frequency and the phase of the VCO 17. There are also shown an input terminal P1 supplied with a video signal (V); an input terminal P2 supplied with an audio signal (A); an amplifier 21 connected to the input terminal P1; an FM modulator 22 which receives the audio signal (A) from the input terminal P2 and also a sound subcarrier signal of a frequency $f_s$ from a second PLL circuit 30; and an AM modulator 24 for amplitude-modulating the video signal (V) amplified by the amplifier 21 and the frequency-modulated output of the FM modulator 22. A main carrier signal of a frequency $f_0$ is supplied from the VCO 17 of the first PLL circuit 15 to the other input terminal of the AM modulator 24, and the amplitude-modulated output (television signal) $S_{TV}$ is supplied to an output terminal P3. Also shown are an external crystal 16a connected between terminals P4 and P5 for the reference oscillator 16, and a channel frequency setting terminal P6. A control voltage $V_{c1}$ at the terminal P6 is converted to a predetermined digital value by an A-D (analog-to-digital) converter 18b, and the division ratio N1 of the variable frequency divider 18 is varied in accordance with the digital value thus obtained. The second PLL circuit 30 comprises a phase comparator 31, a VCO 32 and a variable frequency divider 33 which are different from those included in the aforementioned first PLL circuit 15. The output of the reference oscillator 16 in the first PLL circuit 15 is frequency-divided by a fixed frequency divider 34 of a division ratio M, and the output thereof is phase-compared by the phase comparator 31. The comparison output thus obtained is then supplied via an LPF (low pass filter) 35 to the VCO 32, thereby controlling the frequency $f_s$ of the sound subcarrier signal. Denoted by P7 is a terminal for setting the frequency of the sound subcarrier signal. A control voltage $V_{c2}$ at the terminal P7 is converted to a predetermined digital value by a three-state switch 36, and the division ratio N2 of the variable frequency divider 33 is controlled in accordance with such digital value There are further shown a terminal P8 for grounding the IC chip 14, and a power supply terminal P9.

In the above constitution, when the video signal (V) and the audio signal (A) are supplied to the input terminals P1 and P2 respectively, the video signal (V) is amplified by the amplifier 21 (with white clip when necessary) and then is supplied to the AM modulator 24.

Meanwhile the audio signal (A) is supplied to the FM modulator 22 where the sound subcarrier signal having a frequency $f_s$ of 6 MHz for example is thereby frequency-modulated, and then the modulated output is supplied to the AM modulator 24. The main carrier signal of a frequency $f_0$ supplied from the VCO 17 of the first PLL circuit 15 is amplitude-modulated and then is fed to the output terminal P3. In this case, the division ratio N1 of the variable frequency divider 18 is varied for changing the frequency $f_0$ of the modulated output $S_{TV}$ in accordance with each channel frequency of, for example, channels 30 to 39 in the UHF television band (544-616 MHz) adopted in Europe. In an example where the reference frequency $f_r$ of the reference oscillator 16 is 8 MHz, the frequency division ratio N1 becomes $f_0/f_r$ when the first PLL circuit 15 is locked, so that if the ratio N1 is changed between 68 and 77, it is possible to set the main carrier frequency $f_0$ to a desired channel frequency at a step of 8 MHz.

With regard to the reference frequency $f_r$ (8 MHz) of the reference oscillator 16, the division ratio M of the fixed frequency divider 34 and the division ratio N2 of the variable frequency divider 33, there exists a relationship of $f_s/N2=f_r/M$ when the second PLL circuit 30 is locked. Consequently, it becomes possible to change, by varying the division ratio N, the sound subcarrier signal frequency $f_s$ of the VCO 32 in the second PLL circuit 30. In an exemplary case where the division ratio N2 is varied among 11, 12 and 13 with the frequency $f_r$ set to 8 MHz and the division ratio M to 16, the frequency $f_s$ can be changed among 5.5 MHz (PAL system in West Germany), 6.0 MHz (PAL system in U.K.) and 6.5 MHz (SECAM system in France). Furthermore, the present invention is so contrived that all of the above-described FM modulator 22, sound subcarrier oscillator 23, AM modulator 24, first PLL circuit 15 and second PLL circuit 30 are composed of a single IC chip 14, whereby a miniature structure is achievable and both the main carrier signal frequency $f_0$ and the sound subcarrier signal frequency $f_s$ can be maintained stable despite occurrence of any temperature fluctuation.

Figure 5:
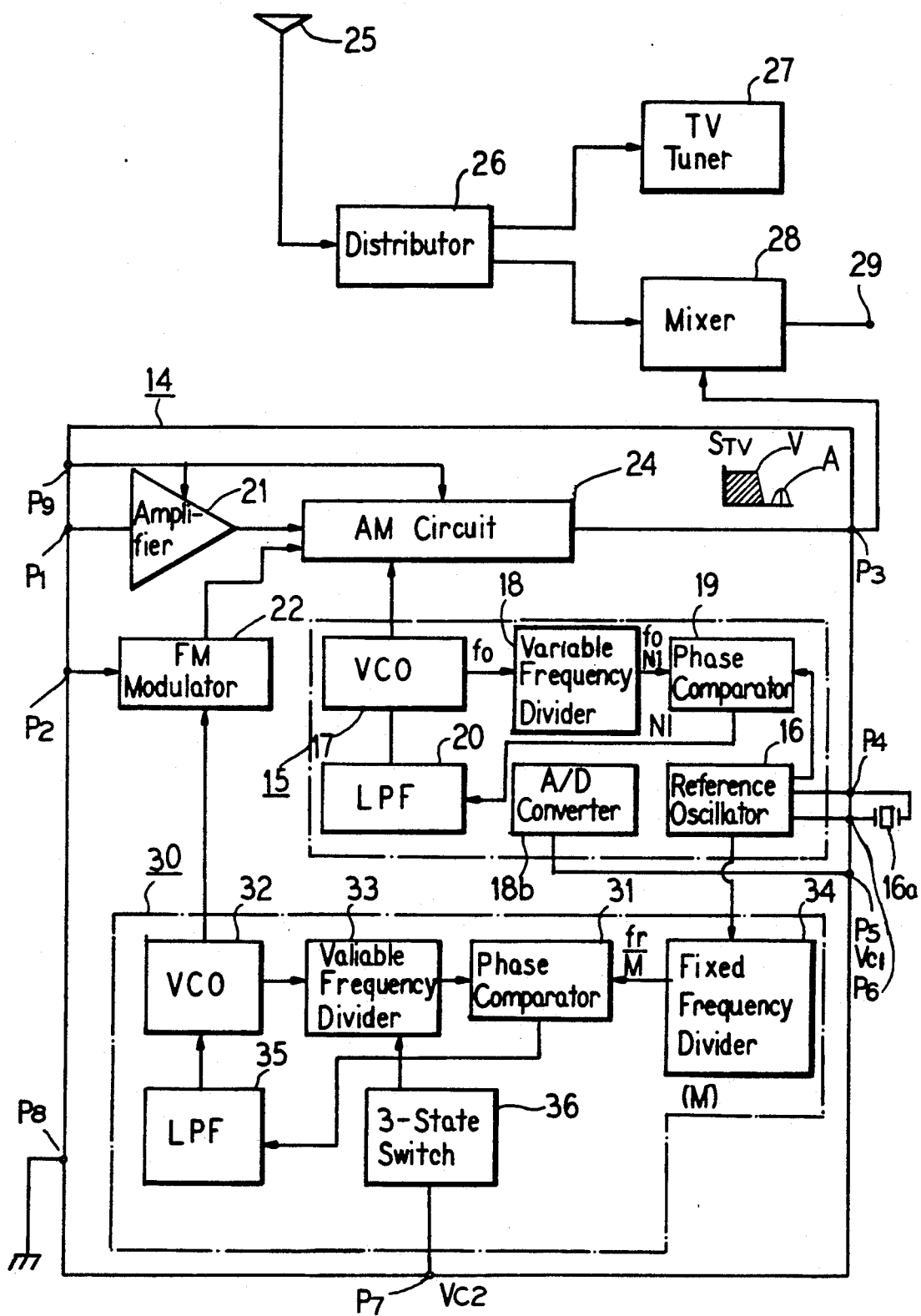
FIG. 5 shows an embodiment of the invention where the RF modulator of FIG. 4 is used in a video tape recorder.

Referring now to FIG. 5 which is a block diagram of a fourth embodiment, a description will be given on an example where the present invention is applied to a video tape recorder.

In FIG. 5, there are included a television antenna 25 and a distributor 26. A television signal from the distributor 26 is supplied to a television tuner 27 and one input terminal of a mixer 28. The other input terminal of the mixer 28 is connected to an output terminal P3 of an IC chip 14 and is thereby supplied with an AM output $S_{TV}$ from an AM modulator 24. And the output of the mixer 28 is supplied to an RF output terminal 29. Since the other circuit configuration is the same as that shown in FIG. 4, a detailed description thereof is omitted here.

In the above constitution, a video signal (V) and an audio signal (A) are supplied respectively to the input terminals P1 and P2 of the single IC chip 14, and the division ratio N of a variable frequency divider 18 in the PLL circuit 15 is set to 68 for example. Then a modulated main carrier signal having a frequency of $f_0$ of 544 MHz is obtained as an AM output $S_{TV}$ from an RF output terminal 29, so that a playback output of the VTR can be monitored by feeding such AM output $S_{TV}$ to an unshown television receiver. The television signal obtained from the antenna 25 is fed via the distributor 26 to the television tuner 27 while being fed as a monitor signal via the mixer 28 to the RF output terminal 29. I this fourth embodiment of FIG. 5 also, satisfactory function and effect can be expected as in the aforementioned RF modulator shown in FIG. 4.

As is obvious from the above description, according to the fourth embodiment where the main carrier signal is amplitude-modulated by the video signal and the FM output obtained through frequency modulation of the sound subcarrier signal by the audio signal, the AM output processed through frequency-division multiplexing can be obtained with facility as a signal of a desired channel frequency by varying the frequency division ratio of the first PLL circuit, and also the frequency of the sound subcarrier signal can be changed by varying the division ratio of the frequency divider in the second PLL circuit.

Furthermore, there is attainable another advantage that, since of the above-described FM modulator, sound subcarrier signal oscillator, AM modulator, first PLL circuit and second PLL circuit are composed of a single IC chip, the structure can be miniaturized and the frequencies of both the main carrier signal and the sound subcarrier signal can be stabilized despite occurrence of any temperature fluctuation.

In addition, due to common use of the reference oscillator for the first and second PLL circuits, the circuit configuration can be further simplified.

Hereinafter a fifth embodiment of the present invention will be described with reference to the accompanying drawings.

Figure 6:
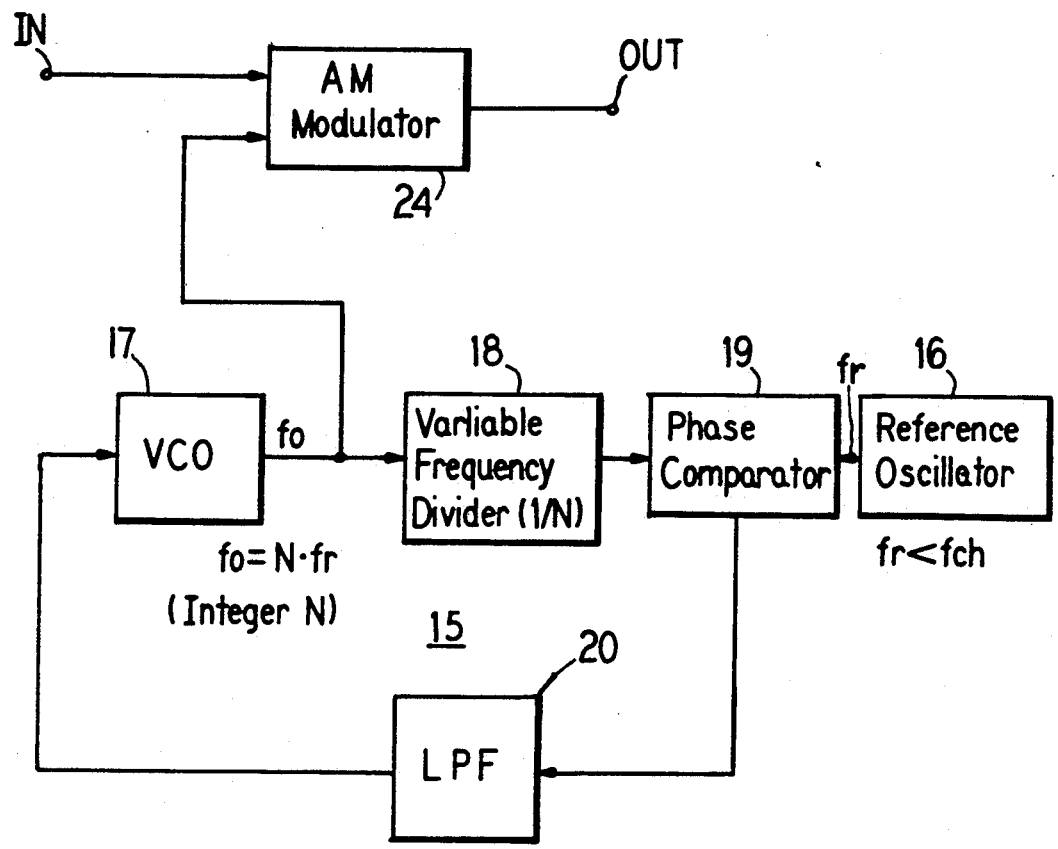
FIG. 6 shows an exemplary modulator employing the PLL circuit of the invention.

FIG. 6 is a block diagram showing a fundamental constitution of a modulator with a PLL, in which reference numeral 15 denotes the PLL circuit as a whole. There are included a reference oscillator 16 for generating a reference frequency signal of a reference frequency $f_r$, and a VCO (voltage-controlled oscillator) 17 having an oscillation frequency $f_0$. The oscillation output of the VCO 17 is frequency-divided by a variable frequency divider 18 of a division ratio N (integer) and then is compared with the reference frequency $f_r$ of the reference oscillator 16. The comparison output thus obtained is supplied to the VCO 17 via an LPF (low pass filter) 20, thereby controlling the frequency and the phase of the VCO 17. The oscillation output of the VCO 17 is supplied to one input terminal of an AM modulator 24, and a modulating signal fed to an input terminal IN is supplied to the other input terminal of the AM modulator 24. Denoted by OUT is an output terminal from which a modulated output is obtained.

In the constitution mentioned, the following operation is performed. When the PLL circuit 15 is locked, the oscillation frequency $f_0$ of the VCO 17 becomes $N \cdot f_r$ (where N is an integer as will be described later). Therefore the channel frequency of the AM modulator 24 is varied, by continuously changing the division ratio N, at a step of a predetermined channel interval frequency $f_{ch}$ in an allocated band for UHF television channels adopted in Europe for example. In the aforementioned European UHF television channels, the channel frequency is varied within a range from channel No. 30 (543.25 MHz) to channel No. 39 (615.25 MHz) at a step of 7.99 MHz less than the channel interval frequency $f_{ch}$ (=8 MHz), and the desired oscillation output of the VCO 17 is amplitude-modulated in the known manner by the modulating signal so that the modulated signal for a television receiver can be obtained from the output terminal OUT of the AM modulator 24.

In an exemplary case where the reference frequency $f_r$ of the reference oscillator 16 is set to 7.99 MHz or 7.985 MHz less than the channel interval frequency $f_{ch}$ (8 MHz), the frequency error $f_E$ (kHz) in the modulated signal can be reduced in comparison with another case of setting the reference frequency $f_r$ to 8 MHz, as shown in Table 1 below.

TABLE 1

| Channel No. | $f_0$ (MHz) | N (Integer) | $f_{E1}$ ($f_r$ = 8 MHz) | $f_{E2}$ ($f_r$ = 7.99 MHz) | $f_{E3}$ ($f_r$ = 7.985 MHz) |
|---|---|---|---|---|---|
| 30 | 543.25 | 68 | +75 | +70 | −27 |
| 31 | 551.25 | 69 | +75 | +70 | −28 |
| 32 | 559.25 | 70 | +75 | +50 | −30 |
| 33 | 567.25 | 71 | +75 | +40 | −31 |
| 34 | 575.25 | 72 | +75 | +30 | −33 |
| 35 | 583.25 | 73 | +75 | +20 | −34 |
| 36 | 591.25 | 74 | +75 | +10 | −36 |
| 37 | 599.25 | 75 | +75 | 0 | −37 |
| 38 | 607.25 | 76 | +75 | −10 | −39 |
| 39 | 615.25 | 77 | +75 | −20 | −40 |

Figure 7:
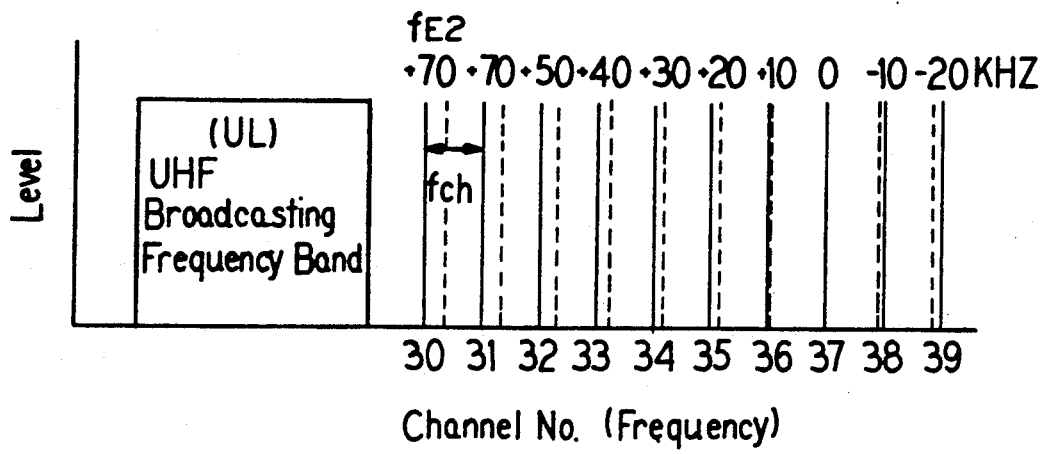
FIG. 7 shows a frequency spectrum of a carrier obtained from the modulator of FIG. 6.

As is apparent from the frequency errors $f_{E1}$–$f_{E3}$ given in Table 1 with respect to the individual reference frequencies, the frequency error in the modulated signal can be reduced by setting the reference frequency $f_r$ to a value less than the channel interval frequency $f_{ch}$ (=8 MHz). FIG. 7 shows an exemplary frequency error spectrum in the present invention, representing the frequency error $f_{E2}$ caused with respect to each channel when the reference frequency $f_r$ is set to 7.99 MHz. Denoted by $U_L$ is a UHF broadcasting frequency band for lower channels. It is possible to further reduce the frequency error $f_{E2}$ or $f_{E3}$ by an AFT (automatic fine tuning) function of an unshown television receiver connected to the output terminal OUT of the AM modulator 24.

Now a description will be given on FIG. 8 which is a block diagram of a sixth embodiment of the present invention applied to a video tape recorder.

Figure 8:
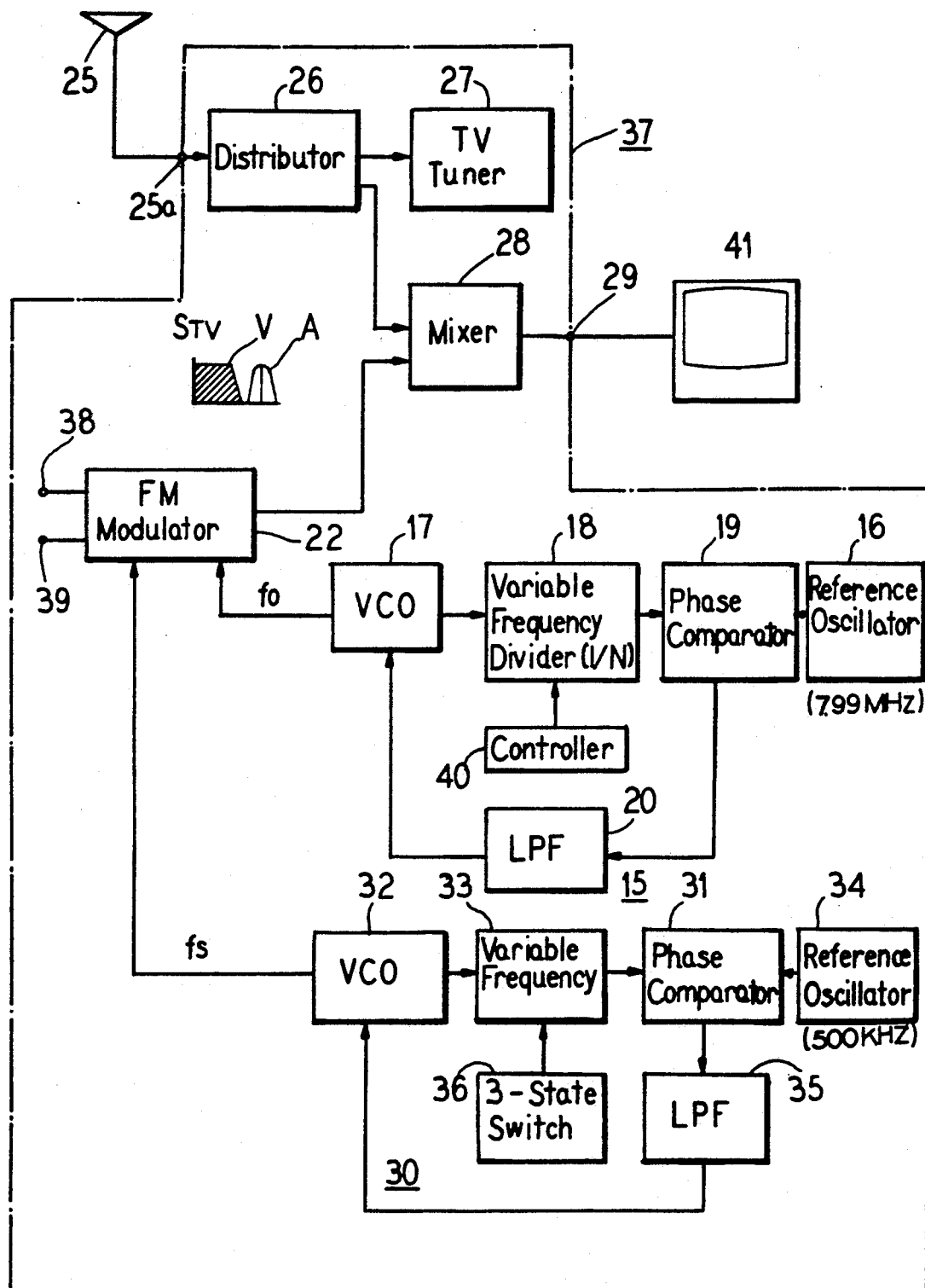
FIG. 8 shows an example where the RF modulator of FIG. 7 is used in a video tape recorder.

In FIG. 8, there are included a television antenna 25, a VTR (video tape recorder) 37 as a whole, an antenna input terminal 25a, an RF output terminal 29, and a television receiver 41. A television signal fed to the antenna input terminal 25a is distributed by a distributor 26 to be supplied to a television tuner 27 while being supplied via a mixer 28 to the RF output terminal 29. A modulation circuit 22 has a video input terminal 38 to receive a video signal (V) and an audio input terminal 39 to receive an audio signal (A). And the modulated output of the modulation circuit 22 is supplied to the mixer 28. In a first PLL circuit 15, a main carrier signal of a frequency $f_0$ is supplied from the VCO 17 to the modulation circuit 22. Denoted by 30 is a second PLL circuit for generating a sound subcarrier signal of a frequency $f_s$. The second PLL circuit 30 comprises a reference oscillator 34, a phase comparator 1, a VCO 32, a variable frequency divider 33 of a division ratio L, an LPF 35, and a three-state switch 36 for varying the division ratio L of the variable frequency divider 33. Further shown is a controller 40 composed of a microprocessor or the like provided for continuously varying the division ratio (integer) of the variable frequency divider 18.

Hereinafter a description will be given with regard to an exemplary case where, in the constitution mentioned above, a video signal (V) and an audio signal (A) are modulated to the channel No. 37 in FIG. 7.

First the division ratio N of the variable frequency divider 18 in the first PLL circuit 15 is varied and set to 75 by the controller 40, and the oscillation frequency $f_0$ of the VCO 17 is set to 599.25 MHz. Subsequently the division ratio L of the variable frequency divider 33 in the second PLL circuit 30 is set to 11 by the three-state switch. Then the oscillation frequency (sound subcarrier signal frequency) $f_s$ of the VCO 32 becomes 5.5 MHz (500 kHz × 11). Therefore, at the output terminal of the modulation circuit 22, there is obtained a television signal $S_{TV}$ formed through amplitude-modulation of the main carrier signal of 599.25 MHz by the baseband video signal (V) and the FM sound channel signal formed through frequency modulation of the sound subcarrier signal of 5.5 MHz by the audio signal (A). The television signal $S_{TV}$ thus obtained is fed from the RF output terminal 29 via the mixer 28 to the television receiver 41. In this case also, as is obvious from Table 1, the frequency error of the main carrier signal in the television signal $S_{TV}$ can be reduced to 37 kHz or substantially to zero similarly to the aforementioned modulator of FIG. 6. Furthermore, since the division ratio N of the variable frequency divider 18 is a two-digit integer, the operation of the variable frequency divider can be accelerated as compared with a known case including a decimal point, and therefore the circuit configuration of the frequency divider can be further simplified. In FIG. 8, if the division ratio L of the variable frequency divider 33 is set to 12 or 13 by the three-state switch 36, the frequency $f_s$ the sound subcarrier signal is changeable to 6 MHz or 6.5 MHz.

As is obvious from the above description, according to the sixth embodiment of the present invention where the division ratio of the variable frequency divider is set to an integer and is variable continuously, it becomes possible to expedite the operation of the variable frequency divider with another advantage of simplifying the circuit configuration thereof.

Furthermore, the frequency error in the modulated output signal is reducible due to the contrivance that the reference frequency of the reference oscillator is set to be less than the predetermined channel interval frequency of the modulation circuit.

What is claimed is:

1. An RF modulator comprising:
   an FM modulator supplied with an audio signal;
   an AM modulator supplied with a video signal and the modulated output of said FM modulator;
   a sound subcarrier signal oscillator for supplying a sound subcarrier signal to said FM modulator;
   a main carrier signal oscillator for supplying a main carrier signal to said AM modulator; and
   a PLL (phase-locked loop) circuit having a reference oscillator, a phase comparator, a voltage-controlled oscillator and a variable frequency divider, in which the output of said voltage-controlled oscillator is frequency-divided by said variable frequency divider and then is phase-compared with the output of said reference oscillator by said phase comparator, and the comparison output thus obtained is fed to said voltage-controlled oscillator to thereby control the same;
   wherein said voltage-controlled oscillator in said PLL circuit is used as said main carrier signal oscillator, and all of said FM modulator, sound subcarrier signal oscillator, AM modulator and PLL circuit are composed of a single IC chip.

2. An RF modulator comprising:
   an FM modulator supplied with an audio signal;
   an AM modulator supplied with a video signal and the modulated output of said FM modulator;
   a sound subcarrier signal oscillator for supplying a sound subcarrier signal to said FM modulator;
   a main carrier signal oscillator for supplying a main carrier signal to said AM modulator;
   a first PLL circuit having a reference oscillator, a first phase comparator, a first voltage-controlled oscillator and a first variable frequency divider, in which the output of said first voltage-controlled oscillator is frequency-divided by said first variable frequency divider and then is phase-compared with the output of said reference oscillator by said first phase comparator, and the comparison output thus obtained is fed to said first voltage-controlled oscillator to thereby control the same; and
   a second PLL circuit having a second phase comparator, a second voltage-controlled oscillator and a second variable frequency divider, in which a frequency-divided output of said reference oscillator in said first PLL circuit and the output of said second voltage-controlled oscillator frequency-divided by said second variable frequency divider are phase-compared with each other by said second phase comparator, and the phase comparison output thus obtained is fed to said second voltage-controlled oscillator to thereby control the same;
   wherein said first voltage-controlled oscillator in said first PLL circuit is used as said main carrier signal oscillator while said second voltage-controlled oscillator in said second PLL circuit is used as said sound subcarrier signal oscillator, and all of said FM modulator, AM modulator, first PLL circuit and second PLL circuit are composed of a single IC chip.

3. An RF modulator comprising:
   a PLL circuit having a reference oscillator, a voltage-controlled oscillator, a variable frequency divider and a phase comparator, in which the output of said voltage-controlled oscillator is frequency-divided by said variable frequency divider and then is compared with the output of said reference oscillator by said phase comparator, and the comparison output thus obtained is fed via a low pass filter to said voltage-controlled oscillator to thereby change the oscillation frequency thereof;
   and a modulation circuit supplied with a modulating signal and the output of said voltage-controlled oscillator, and generating a modulated output of a predetermined channel interval frequency;
   wherein the division ratio (integer) of said variable frequency divider is continuously varied, and the reference frequency of said reference oscillator is set to be less than the predetermined channel interval frequency of said modulation circuit.

4. An RF modulator comprising:
   an FM modulator supplied with an audio signal;
   an AM modulator supplied with a video signal and the modulated output of said FM modulator;
   a sound subcarrier signal oscillator for supplying a sound subcarrier signal to said FM modulator;

a main carrier signal oscillator for supplying a main carrier signal to said AM modulator;

a first PLL circuit having a reference oscillator, a first phase comparator, a first voltage-controlled oscillator and a first variable frequency divider, in which the output of said first voltage-controlled oscillator is frequency-divided by said first variable frequency divider and then is phase-compared with the output of said reference oscillator by said first phase comparator, and the comparison output thus obtained is fed to said first voltage-controlled oscillator to thereby control the same; and a second PLL circuit having a fixed frequency divider for frequency-dividing the oscillation signal from said reference oscillator, a second voltage-controlled oscillator, a three-state switch, a second variable frequency divider supplied with the output signal of said second voltage-controlled oscillator so that the frequency division ratio thereof is controlled by said three-state switch, a second phase comparator for phase-comparing the output signal of said second variable frequency divider with the output signal of said fixed frequency divider, and a low pass filter for converting the output signal of said second phase comparator and controlling said second voltage-controlled oscillator by the converted signal thus obtained;

wherein all of said FM modulator, AM modulator, sound subcarrier signal oscillator, main carrier signal oscillator, first PLL circuit and second PLL circuit are composed of a single IC chip.

5. An RF modulator according to claim 4, wherein the reference frequency of said reference oscillator is set to be less than 8 MHz; the division ratio of said first variable frequency divider in said first PLL circuit is set to 75; the oscillation frequency of said first voltage-controlled oscillator in said first PLL circuit is set to 599.25 MHz; and the division ratio of said second variable frequency divider in said second PLL circuit is set to 11.

* * * * *